United States Patent

[11] 3,611,064

[72] Inventors John W. Hall, II
Mentor;
William E. Tragert, Chagrin Falls, both of Ohio
[21] Appl. No. 841,342
[22] Filed July 14, 1969
[45] Patented Oct. 5, 1971
[73] Assignee General Electric Company

[54] OHMIC CONTACT TO N-TYPE SILICON CARBIDE, COMPRISING NICKEL-TITANIUM-GOLD
5 Claims, 5 Drawing Figs.

[52] U.S. Cl. .......... 317/234 R, 317/235 N, 317/234 L, 317/234 M, 317/234 N
[51] Int. Cl. .......... H01l
[50] Field of Search .......... 317/235 (5.2), 234 (5.3), 234 (5.4), 234, 235, 235 (27), 237, 235 N, 234 L, 234 M, 234 N

[56] References Cited
UNITED STATES PATENTS

| | | | |
|---|---|---|---|
| 3,436,614 | 4/1969 | Nagatsu et al. | 317/234 |
| 3,458,779 | 7/1969 | Blank | 317/234 |

FOREIGN PATENTS

| | | | |
|---|---|---|---|
| 791,343 | 7/1968 | Canada | 317/234 |

*Primary Examiner*—John W. Huckert
*Assistant Examiner*—Martin H. Edlows
*Attorneys*—Henry P. Truesdell, Frank L. Neuhauser, Oscar B. Waddell and Norman C. Fulmer

ABSTRACT: A light-emitting silicon carbide diode comprising a chip of SiC containing a PN junction in which ohmic contact is made to the N-side by thin evaporated films of nickel, titanium and gold superposed one on the other and fired to provide a ternary alloy thereof. This allows thermocompression bonding of a gold wire to the excess of gold at the top of the contact. The contact to the P-side may consist of a thin film of evaporated nickel chrome.

Inventors:
John W. Hall, II
William E. Tragert
by [signature]
Their Attorney

OHMIC CONTACT TO N-TYPE SILICON CARBIDE, COMPRISING NICKEL-TITANIUM-GOLD

CROSS-REFERENCES TO RELATED APPLICATIONS

U.S. Pat. No. 3,458,779 issued July 29, 1969 of John M. Blank and Ralph M. Potter, entitled "SiC PN Junction Electroluminescent Diode with a Donor Concentration Diminishing from the Junction to One Surface and an Acceptor Concentration Increasing in the Same Region" and similarly assigned.

BACKGROUND OF THE INVENTION

The invention relates to light-emitting diodes or solid-state lamps of silicon carbide which comprises a crystal chip containing a PN junction. The N-type region of the chip may be nitrogen doped and the P-type region may be boron and/or aluminum doped. It is necessary to provide contacts to both sides of the semiconductor chip which should be ohmic, that is nonrectifying, and as low in resistance as possible. For a practical device it is also necessary that the chip be mounted securely on a header or base disk.

In one commercially available silicon carbide solid-state lamp, the SiC chip is provided with a P-side ohmic contact by means of a thin film of evaporated aluminum and it is soldered P-side down on the header. Light is emitted through the upper N-side to which a small dot contact is made by a gold-tantalum alloy which is fired on. Connection to the N-side dot contact is made by thermocompression bonding.

Although the foregoing structure has been found adequate for commercial production of solid-state silicon carbide lamps, contacts which are more reliable and which have a lower contact resistance are desirable.

SUMMARY OF THE INVENTION

In accordance with the invention, a low-resistance-ohmic contact to N-type SiC comprises evaporated thin films of nickel, titanium and gold superposed one on the other and fired in inert gas at 1,200° to 1,500°C. To obtain small dot contacts which do not interfere with the transmission of light through the N-side, the three layers of the film may be deposited under vacuum on a SiC platelet through a mask having holes of appropriate size laid out according to the dicing pattern intended to be followed. After firing, a ternary phase exists which forms a low-resistance-ohmic contact to the N-type SiC and there is an excess of gold at the top of each contact which allows a thermocompression bond thereto with a fine gold wire. The P-side contact may be an evaporated thin film of nickel-chrome and the chip is preferably mounted P-side down on a header or base disc and soldered or brazed in place.

DETAILED DESCRIPTION

Figures 1, 2, 3, 4A, 4B:
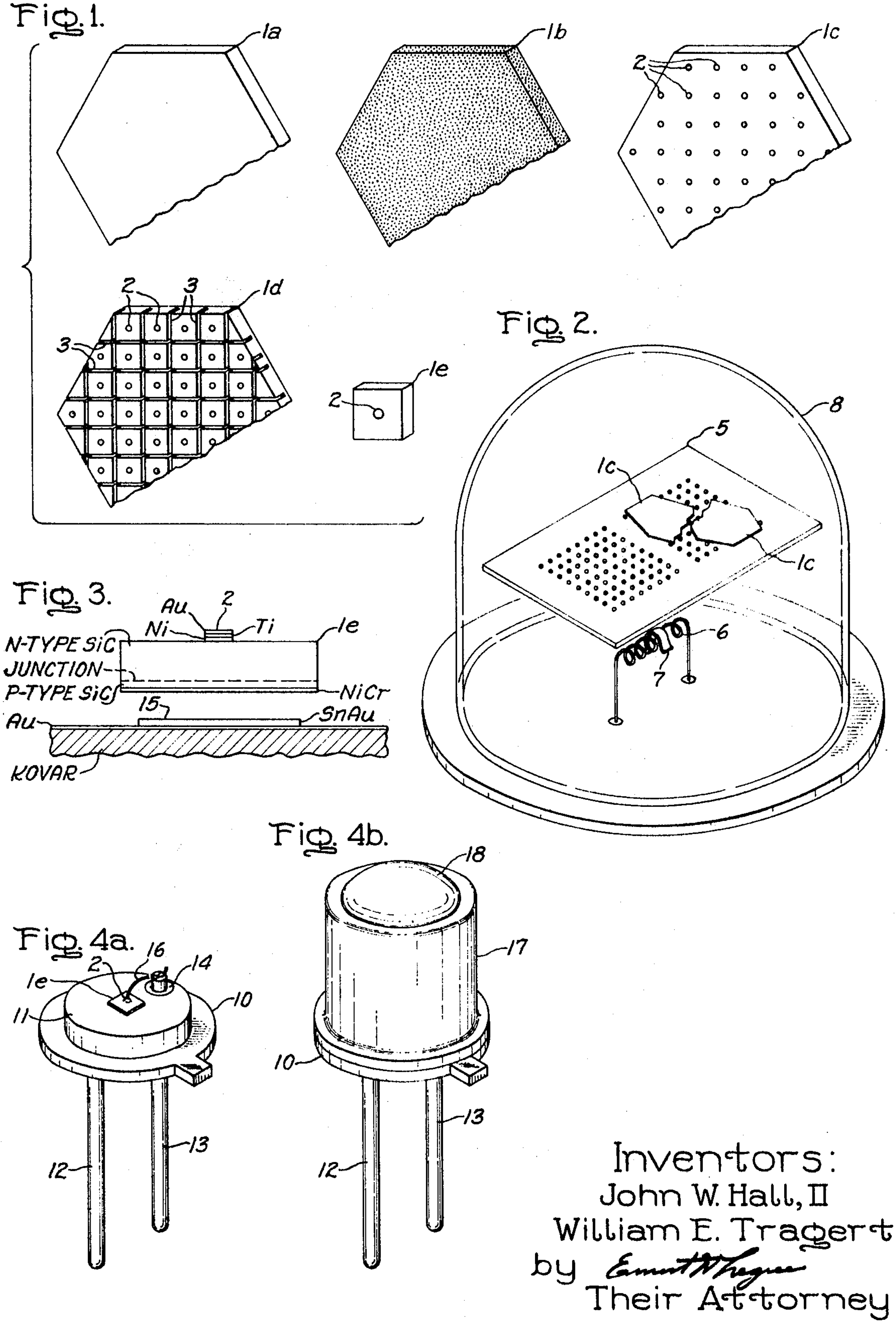
FIG. 1 illustrates successive stages in the processing of a silicon carbide platelet to a light-emitting crystal chip ready for mounting on a header.
FIG. 2 illustrates apparatus for evaporating small area thin films onto silicon carbide platelets.
FIG. 3 illustrates schematically the various layers present in an SiC chip prior to firing to make it ready for mounting on a header.
FIGS. 4*a* and *b* illustrate a silicon carbide light-emitting diode or lamp.

A single crystal or platelet of green nitrogen-doped alpha SiC which has been ground and polished to plane surfaces perpendicular to the C-axis is shown at *la* in FIG. 1. Boron and aluminum may be diffused into the crystal, preferably in the manner described in the aforementioned Blank and Potter application, in order to make a junction. Diffusion creates a P-type surface layer, typically 0.1- to 10-microns thick, on both faces of the platelet, as shown at 1*b* by light stippling. The P-type layer is then ground off on one side of the crystal to expose the original N-type bulk material. Typically, grinding may reduce the thickness of the crystal or wafer to about 0.010–0.015 inch.

In subsequent processing, the platelet is diced, that is divided into square dice or chips approximately 1 mm. × 1 mm. in size, and each such chip is mounted on a header to make a solid state lamp. Each chip requires an ohmic contact to the P-side which may extend over the entire area of the P-side and an ohmic contact to the N-side which should be small in order to obstruct a minimum of the light emitted through the N-side. The small area dot contacts 2 on the N-side are shown at stage 1*c* of the platelet, and they are laid out in a pattern corresponding to the dice into which the platelet will be cut. At stage 1*d*, the platelet or wafer is shown partially cut through or scored on the exposed N-side along lines 3 which place the dot contacts 2 about in the center of the dice. A single die or chip which has been broken off from the platelet is shown at 1*e*.

To make the small area ohmic contacts to the N-side, the platelet may be placed over the grid or masked area of a molybdenum plate 5 shown in FIG. 2. There are two masked areas in the plate, each about 1 inch square, two crystals or platelets 1*c* of silicon carbide being shown on one masked area. The masked area contains small holes in the order of 0.005 inch diameter in an evenly spaced array corresponding to the center to center distance of the chips into which the platelet will eventually be cut or diced. The spacing will of course depend upon the size of chip desired and the thickness of the diamond saw or scribing tool. A typical spacing between holes in the mask if 40 to 50 mils to produce 1 mm. square chips.

The mask is arranged to hold the SiC platelets over tungsten evaporator coils suitable for evaporating nickel, titanium and gold. Only one tungsten coil or filament 6 having a small strip of nickel 7 wrapped around it is illustrated in the drawing. At least one such coil is provided for each metal to be evaporated in order that the operation may be performed without breaking vacuum. A bell jar 8 is lowered over the mask and evaporator coil, and vacuum is pulled down to at least $10^{16}$ torr, preferably $10^{17}$ torr. The temperature of the silicon carbide chip during the deposition is barely above the ambient, for instance 30° C., and the three films are deposited in sequence without breaking vacuum. By way of example, the film thicknesses may be as follows:

Nickel 1,000–2,000 A.
Titanium 200–500 A.
Gold 5,000–10,000 A. The dot contact 2 with superposed films of Ni, Ti and Au greatly exaggerated in thickness is shown in FIG. 3.

After the contact system is deposited, the silicon carbide platelet is fired in an inert atmosphere such as argon at 1,200°–1,500° C. for a few seconds. Firing in an inert atmosphere is important and appears to be responsible for the formation of a ternary alloy of Ni, Ti and Au resulting in a low-resistance-ohmic contact to N-type silicon carbide having a donor concentration as low as $1\times10^{18}$ donors/cc. The concentration of gold in the top layer permits thermo-compression bonding of a fine gold wire thereto, and the titanium layer intervening between the nickel and gold layers prevents agglomeration of the gold.

After the N-side dot contacts have been made, the crystals may be turned over and placed below the evaporator coil to form the P-side contacts extending over the entire crystal surface. Nichrome wire may be used, or alternatively nickel or chromium, and is vaporized in a vacuum in the same fashion by a tungsten evaporator coil.

After deposition of the contact films, the wafer is partially cut through or scored equidistantly between the lines of dot contacts as shown at 1*d* in FIG. 1 in order to form square dice or chips approximately 1 mm. ×1 mm. in size. At this point, the scored platelet is sometimes referred to as a dotted raft. The raft is next broken along the score lines into dice or chips as shown at 1*e*.

To make a solid state lamp, a single chip is mounted on a transistor-type header 10 shown in FIG. 4*a*. The header comprises a gold-plated base disc 11 of Kovar which is a nickel-cobalt-iron alloy having a coefficient of expansion substantially matching that of silicon carbide. Ground lead wire 12 is attached to the underside of the base disc, and another lead wire 13 projects through the disc but is insulated therefrom by a sleeve 14. A tin-gold soldering alloy is laid down in a small area on top of the gold-plated header disc 11, as shown at 15 in FIG. 3. This may be done by vacuum evaporation, using a mask to confine the deposition of metal to the desired area. The chip is then placed P-side down on the header as illustrated in FIG. 3, and pressure applied while heating to a temperature sufficient to melt the alloy, suitably 400° to 500° C. in a reducing atmosphere like hydrogen.

After the chip or die is mounted on the header, a soft metal wire 16, suitably of gold, is bonded by thermocompression bonding to the alloy dot 2 on the top side of the die, bent over laterally, and bonded to the top of lead wire 13 projecting through the disc as shown in FIG. 4 *a*. The header may be capped by a metal can or cover 17 equipped with a lens 18 in its end wall as shown in FIG. 4*b*, whereby to enclose and protect the light-emitting crystal chip.

What we claim as new and desire to secure by Letters Patent of the United States is:

1. A light-emitting diode comprising an SiC crystal having one region made N-type by donor impurities and another region made P-type by acceptor impurities, said regions forming a light-emitting junction, and a small area ohmic contact to said N-region consisting of a fired-on ternany alloy of nickel, titanium and gold.

2. A diode as in claim 1 including a header to which said SiC crystal is attached through its P-side said header including an insulated lead, and a fine gold wire attached to said insulated lead and thermocompression bonded to said small area contact to the N-side.

3. A diode as in claim 1 having an ohmic contact to the P-region consisting of an evaporated film of nickel-chromium, nickel or chromium.

4. A diode as in claim 4 including a header to which said SiC crystal is soldered P-side down, said header including an insulated lead, and a fine gold wire attached to said insulated lead and thermocompression bonded to said small area contact to the N-side.

5. A diode as in claim 1, in which said ternary alloy comprises relatively more gold than each of the nickel and titanium constituents.